(12) United States Patent
Mertens et al.

(10) Patent No.: US 10,935,202 B2
(45) Date of Patent: Mar. 2, 2021

(54) LED LIGHTING UNIT

(71) Applicant: Lumileds LLC, San Jose, CA (US)

(72) Inventors: Jürgen Mertens, Wuerselen (DE); Astrid Marchewka, Aachen (DE)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 16/340,329

(22) PCT Filed: Oct. 9, 2017

(86) PCT No.: PCT/EP2017/075646
§ 371 (c)(1),
(2) Date: Apr. 8, 2019

(87) PCT Pub. No.: WO2018/069231
PCT Pub. Date: Apr. 19, 2018

(65) Prior Publication Data
US 2020/0041086 A1 Feb. 6, 2020

(30) Foreign Application Priority Data

Oct. 11, 2016 (EP) ..................................... 16193222

(51) Int. Cl.
| | | |
|---|---|---|
| *F21S 41/19* | (2018.01) | |
| *F21S 45/49* | (2018.01) | |
| *F21S 41/141* | (2018.01) | |
| *F21S 45/47* | (2018.01) | |
| *H01R 13/717* | (2006.01) | |
| *H01L 25/075* | (2006.01) | |
| *H01R 43/24* | (2006.01) | |
| *F21Y 115/10* | (2016.01) | |

(52) U.S. Cl.
CPC ........... *F21S 41/192* (2018.01); *F21S 41/141* (2018.01); *F21S 45/47* (2018.01); *F21S 45/49* (2018.01); *H01L 25/0753* (2013.01); *H01R 13/7175* (2013.01); *H01R 43/24* (2013.01); *F21Y 2115/10* (2016.08)

(58) Field of Classification Search
None
See application file for complete search history.

(56) References Cited

U.S. PATENT DOCUMENTS 8,567,987 B2    10/2013   Wronski
9,316,387 B1 *   4/2016   Olsson ...................... F21S 8/03
(Continued)

FOREIGN PATENT DOCUMENTS

DE    102011085655 A1    8/2013
EP         2348248 A1    7/2011
(Continued)

*Primary Examiner* — Ashok Patel
(74) *Attorney, Agent, or Firm* — Volpe Koenig (57) ABSTRACT

The invention describes a LED lighting unit comprising a heatsink; an LED module mounted onto the heatsink, which LED module comprises a carrier, a number of LED dies mounted on the carrier, and LED electrode contacts formed on the carrier; an overmould formed to encase the heatsink and to expose the mounting surface region of the heatsink upon which the LED module is mounted; and an electrical interface also encased in the overmould and arranged to electrically connect the LED module to a power supply. The invention further describes a method of manufacturing such an LED lighting unit.

17 Claims, 5 Drawing Sheets

(56) References Cited

U.S. PATENT DOCUMENTS

| | | |
|---|---|---|
| 10,551,011 B2 * | 2/2020 | Bancken ................ F21V 7/28 |
| 2007/0121326 A1 | 5/2007 | Nall et al. |
| 2008/0023721 A1 * | 1/2008 | Lee ..................... H01L 33/56 |
| | | 257/99 |
| 2008/0244944 A1 | 10/2008 | Nall et al. |
| 2009/0219732 A1 | 9/2009 | Gingrich, III et al. |
| 2018/0283644 A1 * | 10/2018 | Mertens ............... F21S 41/192 |

FOREIGN PATENT DOCUMENTS

| | | |
|---|---|---|
| WO | 2007047398 A2 | 4/2007 |
| WO | 2016156463 A1 | 10/2016 |

* cited by examiner

LED LIGHTING UNIT

FIELD OF THE INVENTION

The invention describes an LED lighting unit, and a method of manufacturing such an LED lighting unit

BACKGROUND OF THE INVENTION

High-power LEDs (light-emitting diodes) are being used as efficient and long-lived light sources in many applications. High-power LEDs become very hot in use, and some kind of heat sink is always required to remove the heat in order to ensure high reliability and a long lifetime. In the known prior art lighting applications, a complete LED module containing one or more LED light sources is mounted to a separate heatsink component, usually with a thermal interface material. The heatsink component is not a part of the LED module, instead these two elements are connected by means of the thermal interface material. In order to install a replacement LED module, it is necessary to first detach or dismount the existing LED module from the heatsink component, to remove the old thermal interface, and then to attach or mount the replacement LED module onto the heatsink component using a new thermal interface. However, the handling and application of the thermal interface materials requires expert knowledge. Technical expertise is also required in order to ensure a very precise placement of the LED module on the heatsink component, particularly in the case of a front lighting application in which even a minor placement error can result in an incorrectly shaped beam. These considerations make the exchange of such an LED module impossible for the ordinary user.

Therefore, it is an object of the invention to provide an improved LED lighting unit that overcomes the problems described above.

SUMMARY OF THE INVENTION

The object of the invention is achieved by the LED lighting unit of claim 1, and by the method of claim 9 of manufacturing such an LED lighting unit.

The LED lighting unit according to the invention comprises a heatsink; an LED module mounted onto the heatsink, which LED module comprises a carrier, a number of LED dies mounted on the carrier, and LED electrode contacts formed on the carrier, and an overmould formed to encase the heatsink and to expose the mounting surface region of the heatsink upon which the LED module is mounted. The LED lighting unit further comprises an electrical interface also encased in the overmould and arranged to electrically connect the LED module to an external power supply. According to the invention, the overmould comprises an outer overmould and an inner overmould. The inner overmould encases at least part of the electrical interface and the outer overmold encases at least part of the inner overmould.

An advantage of the inventive LED lighting unit is that it is entirely self-contained or "thermally self-supporting", i.e. it is a stand-alone unit that already incorporates a heatsink. Therefore, the inventive LED lighting unit can be installed or replaced with ease, and a user does not need any special technical knowledge or skills to perform such steps. For example, anyone can install the inventive LED lighting unit into the housing of an appropriate lighting application. All the user need do is insert the LED lighting unit into the housing, and then connect it to the power supply. This is particularly favourable when an LED lighting unit needs to be replaced. As mentioned above, the cost of replacing a comparable prior art LED lighting device can be considerable because of the technical expertise required to ensure that a replacement LED module is correctly mounted to a heat-dissipating component.

According to the invention, the method of manufacturing an LED lighting unit comprises the steps of assembling an LED module comprising a carrier, a number of LED dies mounted on the carrier, and LED electrode contacts formed on the carrier; providing a heatsink with a mounting surface region for receiving the LED module; providing a electrical interface for electrically connecting the LED module to a power supply; encasing the heatsink and the electrical interface in an overmould, thereby leaving an opening in the overmould to expose the mounting surface on the heatsink; mounting the LED module onto the exposed mounting surface; and forming electrical connections between the LED module and the electrical interface. The overmould comprises an outer overmould and an inner overmould. The inner overmould encases at least part of the electrical interface and the outer overmold encases at least part of the inner overmould. It will be understood that the steps need not be carried out strictly in this given order.

The inventive method results in a thermally self-contained lighting unit that does not need to be mounted to any further heat-dissipating component. Instead, with relatively little effort, a complete lighting unit can be obtained that is self-contained and robust.

The dependent claims and the following description disclose particularly advantageous embodiments and features of the invention. Features of the embodiments may be combined as appropriate. Features described in the context of one claim category can apply equally to another claim category.

The heatsink is preferably a solid piece of a thermally conductive metal such as aluminium or copper. For example, a block of aluminium can be extruded in a form that has a H-shaped cross-section. A suitably thick "slice" of the extruded block can be cut to serve as the heatsink of the inventive LED lighting unit. The surface of the heatsink can be surface-treated as desired, for example by applying a layer of conformal coating or by potting to provide a protection against corrosion.

In the following, without restricting the invention in any way, it may be assumed that the LED lighting unit is intended for use in a lighting application required very intense bright light, for example in an automotive front lighting application. The light-emitting diodes of such lighting applications become very hot, easily reaching junction temperatures of more than 135° C., and the transport of heat away from the LED dies must be efficient and effective. Temperatures within the LED lighting unit can depend on various parameters such as the ambient temperature, heat sink size etc. Typically, the system should be designed to take any such parameters into account and to ensure that the maximum LED junction temperature (specified by the LED manufacturer) is not exceeded.

For this reason also, the LED module is preferably mounted onto the exposed surface region of the heatsink using a thermally conductive material such as thermal paste. Alternatively, a thermal pad may be used, or a thermal glue, or the LED module can be soldered into place.

The overmould can be made of any suitable material. In a preferred embodiment of the invention, the overmould comprises a suitable plastic material. For example, a thermally conductive plastic could be used. Alternatively or in addition, the plastic material can be electrically isolating. A plastic material can be moulded with relatively little effort into the desired overmould shape. When the moulding procedure is complete, the overmould presents a favourably hard and robust enclosure about the heatsink, leaving only the LED module exposed.

The overmould can be formed in a single step, i.e. the inventive LED lighting unit can comprise a single overmould. In an alternative embodiment of the invention, however, a two-part overmould may be preferred. In this case, an inner overmould can be formed to encase at least the lead frame and the socket connector. Such an inner overmould is preferably shaped to engage firmly with the heatsink, so that the overmoulded part and the heatsink can be handled as a single unit. An outer overmould can then be formed to encase the inner overmould (with lead frame and socket connector) and the heatsink.

The step of mounting the LED module onto the exposed mounting surface of the heatsink can be performed prior to the overmoulding step. This may place certain constraints on the overmoulding apparatus, since the LED dies on the carrier must be protected from high temperatures. Furthermore, mechanical forces ensuing during the overmoulding step may stress the LED module. Therefore, in a preferred embodiment of the invention, the overmould is formed to enclose the heatsink and the electrical interface, and to leave a "window" exposing the mounting surface region, and the LED module is placed onto the exposed mounting surface region after the overmoulding step.

Preferably, the overmould comprises a window that is shaped to ensure that the overmould does not affect or interfere with the light emitted from the LED module. For example, one or more of the side walls of the window can be slanted so that the outer perimeter of the window (at the outer surface of the overmould) is greater than the inner perimeter of the window (at the level of the heatsink). In this way, the light emitted by the LEDs is not affected in any way by the overmould.

The inventive LED lighting unit preferably incorporates a connector to a power supply, for example a socket connector shaped to mate with a corresponding plug connector. A suitable socket connector part is preferably embedded in the overmould so that only the recessed socket is visible to the user. The electrical interface between the LED module and the socket connector preferably comprises a lead frame arranged to extend from the mounting surface region of the heatsink into the overmould, where it is welded or otherwise connected to leads that terminate in the socket connector formed in the overmould. A lead frame can be formed as a single part that is embedded in the overmould, or in a preferred embodiment of the invention—it can comprise physically separate sections for the anode and cathode connections to the LED module. In either case, the electrical interface is essentially completely embedded in the overmould, leaving only the lead frame contact regions exposed. The lead frame portion of the electrical interface can comprise two separate elements, each connected to a corresponding connector (within the overmould) that terminates in the socket connector. Furthermore, a lead frame can support a number of electrical components of an LED driver circuit. For example, a transient voltage suppression diode can be mounted on a lead frame as part of the LED driver circuit. If the material chosen for the overmould is electrically conductive, the lead frame and any other relevant parts of the electrical interface are preferably electrically isolated from the overmould, e.g. by enclosing them in a suitable insulating coating.

The carrier can be made of any suitable material that can support the LED dies and which can withstand the high temperatures arising during operation of the lighting unit. For example, the LED dies can be mounted onto a printed circuit board (PCB), so that the LED module in this case comprises the PCB, the LED dies, and electrode contacts for contacting the anode and cathode of the LED die(s). In a preferred embodiment of the invention, the LED module comprises a ceramic carrier. Ceramic materials are a favoured choice since they are electrically isolating and are also very efficient conductors of heat.

In a preferred embodiment of the invention, the heatsink and overmould are prepared in advance, and the LED module is also prepared in advance. This approach has several advantages: the overmoulded heatsink part can be tested to ensure that the embedded electrical interface is functionally correct, the LED module can also be tested to ensure correct functionality, etc. This allows defective parts to be identified in advance, preventing them from being used in a lighting unit. Another significant advantage of this manufacturing approach is that the LED module can be placed with a very high degree of precision into the overmould window. To this end, the overmould is preferably formed to include reference features that assist in the placement of the LED module. The window itself can be a reference feature, for example. Any number of further reference features can also be formed, and these can have any shape (recess, notch, ridge, tab, etc.). The positions and shapes of such reference features are determined precisely by the overmould tool, as will be known to the skilled person. A placement tool can use one or more reference features to very precisely place the complete LED module onto the exposed heatsink region. A very favourable precision within a few tens of micrometres can be achieved in this way. The inventive LED lighting unit is therefore particularly suited to a lighting application that requires very precise placement of the LED light source(s), for example in an automotive front beam application.

As indicated above, the inventive LED lighting unit may be installed into a lighting application by placing it in an appropriate housing, and to facilitate this step, the inventive LED lighting unit preferably comprises a number of reference features formed in the overmould to match corresponding reference features of the housing into which it will be inserted. These can be the same reference features that were used during mounting of the LED module onto the heatsink, and/or dedicated reference features, as appropriate.

Other objects and features of the present invention will become apparent from the following detailed descriptions considered in conjunction with the accompanying drawings. It is to be understood, however, that the drawings are designed solely for the purposes of illustration and not as a definition of the limits of the invention.

BRIEF DESCRIPTION OF THE DRAWINGS

In the drawings, like numbers refer to like objects throughout. Objects in the diagrams are not necessarily drawn to scale.

DETAILED DESCRIPTION OF THE EMBODIMENTS

Figure 1:
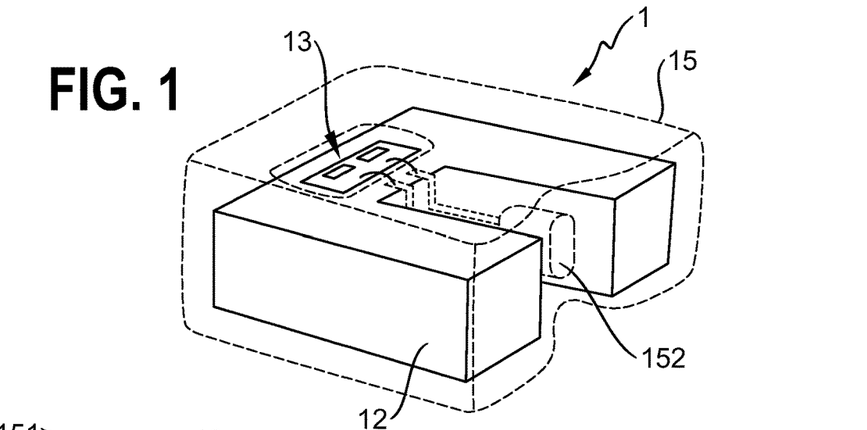
FIG. 1 shows a perspective view of an embodiment of the inventive LED lighting unit.

FIG. 1 shows a transparent perspective view of an embodiment of the inventive LED lighting unit 1, showing the enclosure 15 or overmould 15 (indicated by the broken line) in place about a heatsink 12. The heatsink 12 exhibits mirror symmetry in this embodiment. Electrical connections are indicated between a socket 152 at one end of the overmould 15 and the LED module 13 that is mounted onto an exposed surface region 120 of the heatsink 12. The overmould 15 has an opening or window 150 that exposes that surface region 120 of the heatsink 12 and the LED module 13. In this embodiment, the heatsink 12 is essentially U-shaped, and is made of a solid block of metal such as aluminium or copper. The heatsink 12 can therefore effectively dissipate heat from the LED module 13 during operation. Furthermore, the overmould 15 is made of a suitable material such as a plastic, which may be thermally conductive, electrically isolating, etc. A thermally conductive overmould 15 can help in the efficient transportation of heat away from the LED module 13 and away from the heatsink 12. An electrically isolating overmould 15 can simplify the overall construction.

The self-contained structure of the inventive LED lighting unit 1 allows it to be easily replaced as a single unit, even by an unskilled person, since there is no need to re-make a thermal contact between a replacement LED unit and a permanent heatsink. The inventive LED lighting unit 1 does not require any other heatsink or heat-dissipating element. Instead, a single heatsink 12 is a built-in element of the inventive self-contained LED lighting unit 1. In a lighting application using the inventive LED lighting unit 1, an unskilled person can easily replace an existing LED lighting unit with a replacement LED lighting unit.

Figure 2:
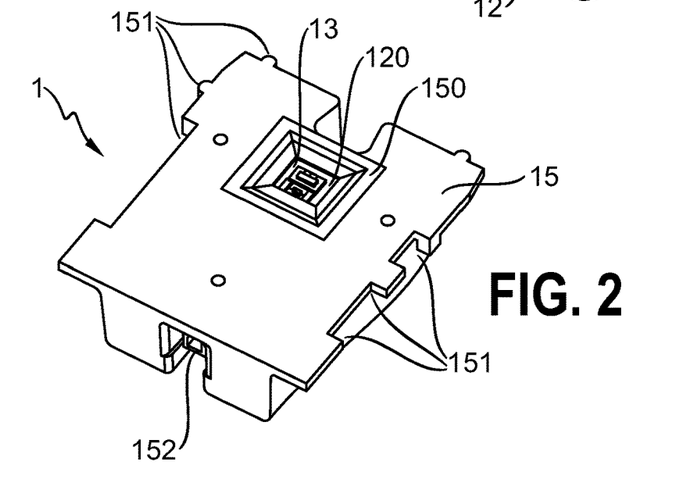
FIG. 2 shows a perspective view of a further embodiment of the inventive LED lighting unit.

FIG. 2 shows a perspective view of another embodiment of the inventive LED lighting unit 1, looking onto the front face of the LED lighting unit 1. This diagram clearly shows the LED module 13 recessed inside a window 150 in the overmould 15 and attached to the heatsink 12. Part of the exposed surface region 120 of the heatsink 12 can be seen between the outer edges of the LED module 13 and the inner sides of the window 150. The socket 152 for connection to a power supply can be partially seen. The diagram also shows reference features 151 or keying features 151 formed in the body of the plastic overmould 15. These will assist in correct placement of the LED lighting unit 1.

Figure 3:
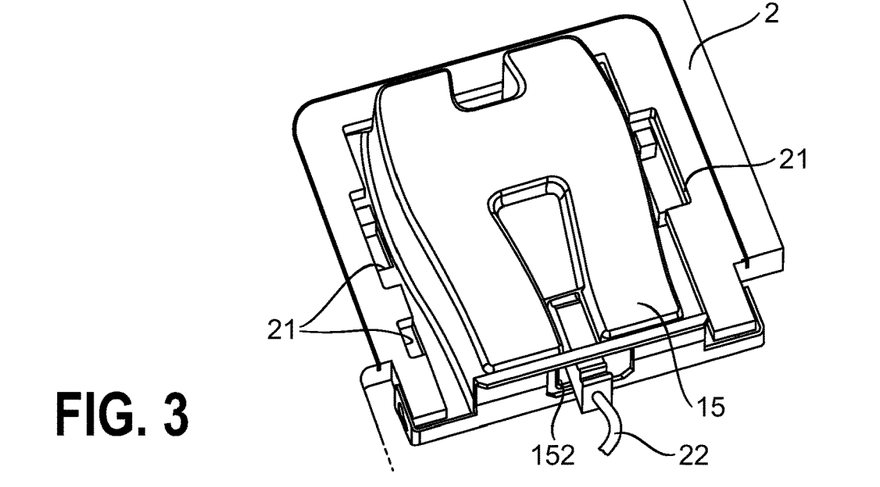
FIG. 3 shows the LED lighting unit of FIG. 2 in place in a housing of a lighting application.

FIG. 3 shows the LED lighting unit 1 of FIG. 2 in place in a housing 2 of a lighting application such as an automotive front lighting unit. The housing 2 also has reference features 21 or keying features 21 that match those of the LED lighting unit 1. The reference features 151, 21 ensure that the user will automatically insert the LED lighting unit 1 correctly into the housing 2. The diagram also shows a plug connector 22 inserted into the socket connector 152. The plug and socket connectors 152, 22 can connect in a snap fit, for example.

Figure 4:
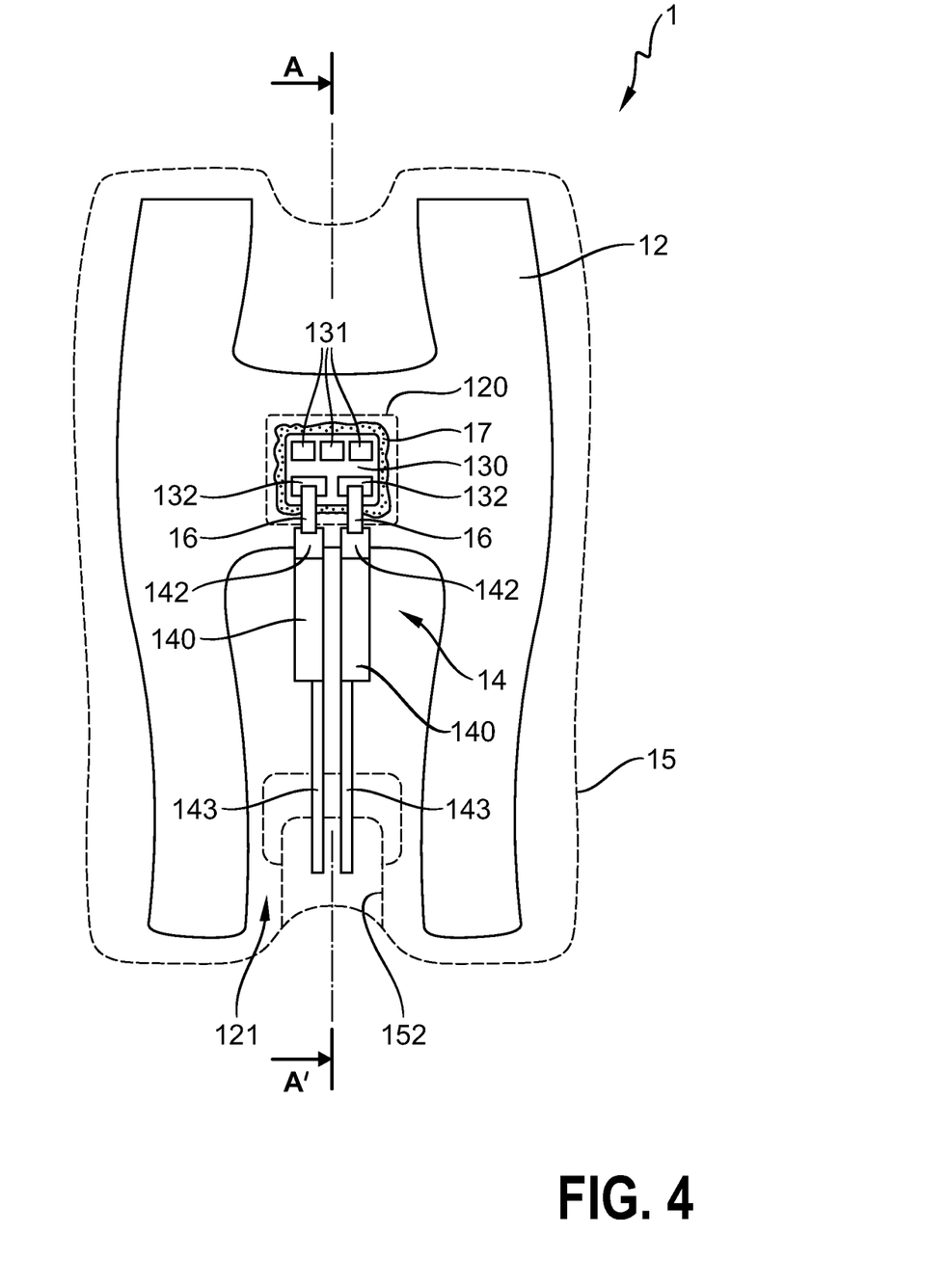
FIG. 4 shows a plan view of a further embodiment of the inventive LED lighting unit.

FIG. 4 shows an embodiment of the LED lighting unit 1, which has a heatsink 12 with an LED module 13 mounted to its surface in a region 120 that is surrounded by a window or opening in a plastic overmould 15 (indicated by the broken line). In this embodiment, the heatsink 12 is essentially H-shaped, with a form that utilizes as much as possible of the volume available in the final LED lighting unit. Other appropriate shapes might be an X-shape, an M-shape, etc. The heatsink 12 can be a slice of an extruded H-shaped body of metal such as aluminium or copper. The "empty space" 121 of the heatsink 12 between the uprights of the "H" will accommodate an electrical interface 14 (only partially shown) that acts as an electrical connection between the LED module 13 and a power supply connector 152 formed in the body of the overmould 15. The electrical interface 14 is shown to comprise lead frame portions 140 terminating in contact regions 142 for connection to the LED module 13. A lead frame 140 may also carry one or more electrical components such as a transient voltage suppression diode. In this embodiment, each lead frame portion 140 is bonded to a connector rod 143 extending into the socket connector 152, for making electrical connection to the pins of a plug connector (not shown). The LED module 13 in this embodiment comprises a ceramic carrier 130 with a series arrangement (or "string") of three LED dies 131 in place. The exposed region 120 will be defined by a window in the plastic overmould 15 which will be formed in a subsequent step to almost completely enclose the heatsink 12. The ceramic carrier 130 also features two electrode contact regions 132 for the anode and cathode connections to the LED series arrangement. These contact regions 132 can be connected by means of ribbon connectors 16 or wire bonds to the corresponding contact regions 142 of the lead frame of the electrical interface 14 embedded in the plastic overmould. The lead frame is positioned so that its contact regions 142 are left exposed in the overmoulding step.

Figure 5:
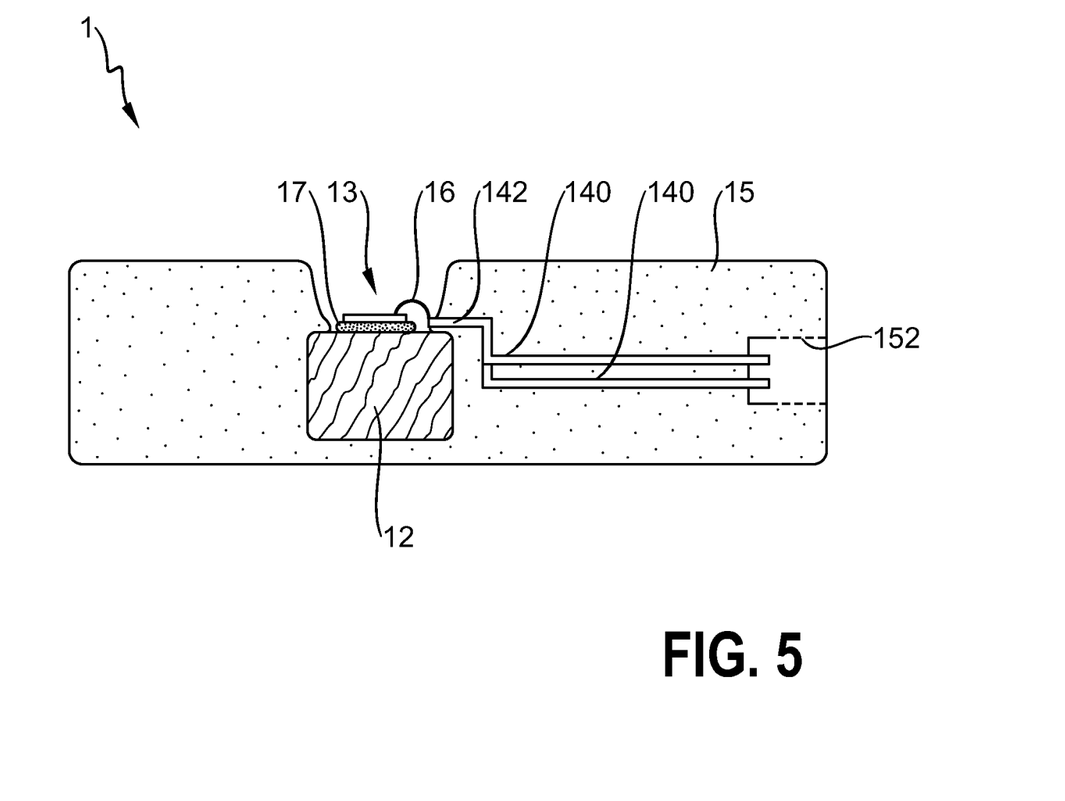
FIG. 5 shows a cross-section taken through the LED lighting unit of FIG. 4.

FIG. 5 shows a cross-section A-A' taken through the LED lighting unit 1 of FIG. 4, showing the LED module 13 mounted to the heatsink 12 by means of a layer of thermal paste 17, and connected to the lead frame of the electrical interface 14 by means of a ribbon connector 16. The electrical interface 14 is almost entirely enclosed by the overmould 15, and has been placed to that only the outer contact regions 142 of the lead frame are exposed in order to make electrical connections to the contact regions of the LED module 13.

Figure 6:
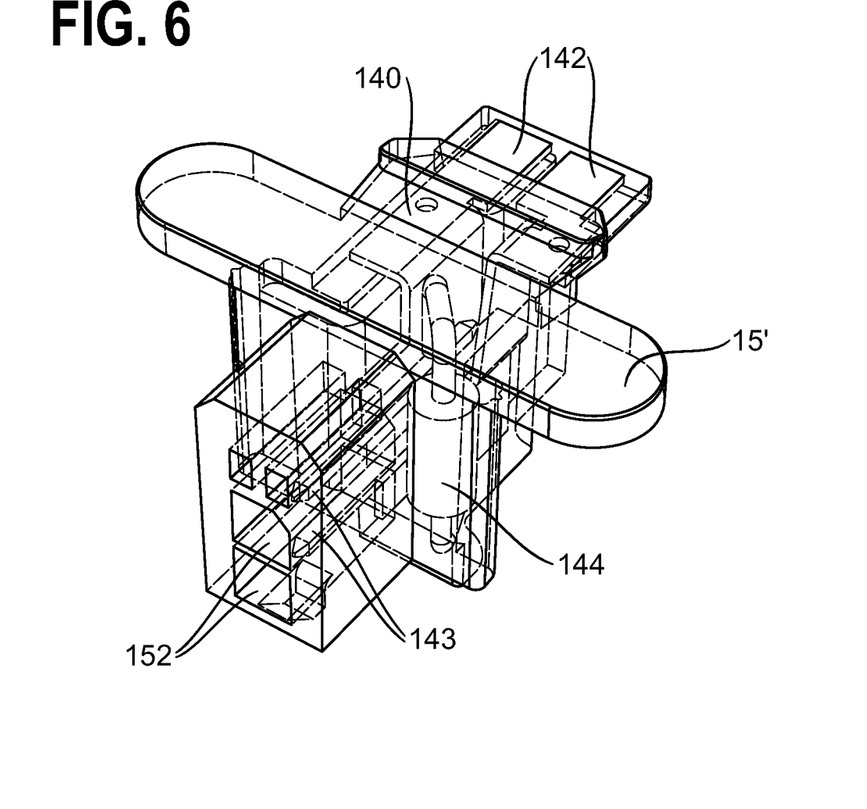
FIG. 6 shows an alternative way of overmoulding a lead frame for an embodiment of the inventive LED lighting unit.

FIG. 6 shows an alternative embodiment, in which an inner overmould 15' is formed to encase the lead frame 14 and the socket connector 152. This inner overmould 15' is formed so that its shape will engage with the heatsink 12. The diagram also indicates the lead frame 140 of the electrical interface (which can be formed in the same manner explained in the preceding drawings), with exposed contact regions 142 at one end of the otherwise overmoulded lead frame 140, and connector pins 143 at the other end of the lead frame 140. The diagram also shows an electrical component 144 of an LED driver circuit, enclosed in the overmould 15'.

Figure 7:
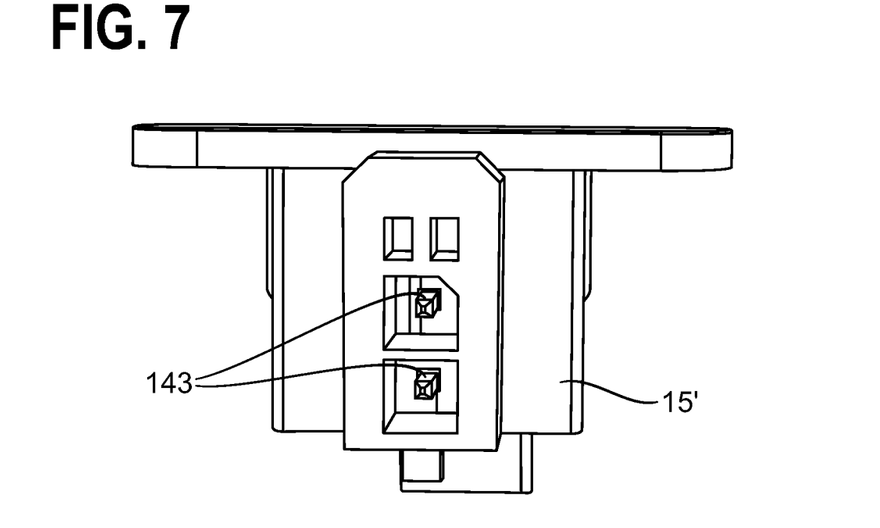
FIG. 7 shows a front view of the overmoulded lead frame of FIG. 6.

FIG. 7 is another view of the embodiment of FIG. 6 and shows a front view of the inner overmould 15', indicating the connector pins 143 of the electrical interface, protruding into the socket connectors 152.

Figure 8:
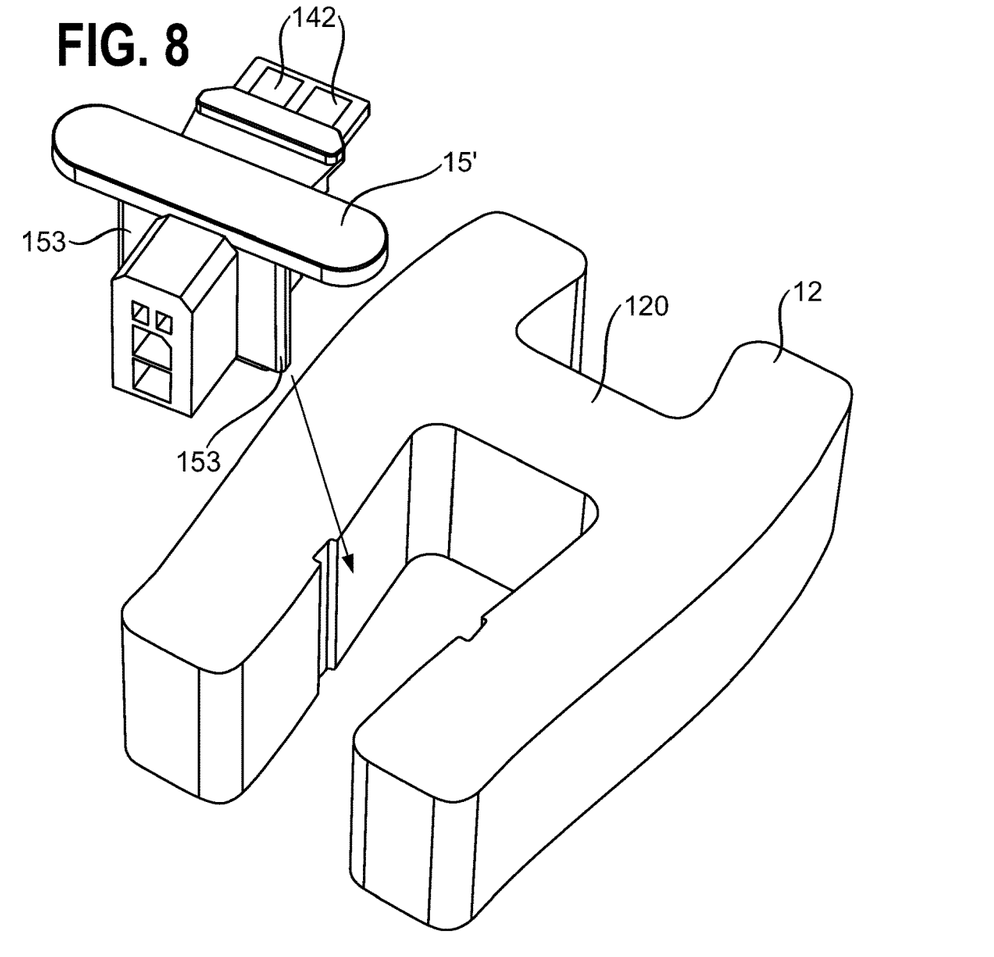
FIG. 8 shows the overmoulded lead frame of FIG. 6 relative to a heatsink.

FIG. 8 illustrates how the inner overmould 15' of FIGS. 6 and 7 can engage with the heatsink 12. In this exemplary embodiment, the inner overmould 15' has been formed to include fins 153 that mate with corresponding grooves in a heatsink 12. When the inner overmould part is pressed into the heatsink 12 (as indicated by the arrow), it is held in a secure manner by the form-fit of the fins 153 and grooves, and the flat front part with the contact regions 142 will align with the contact region 120 of the heatsink 12.

Figure 9:
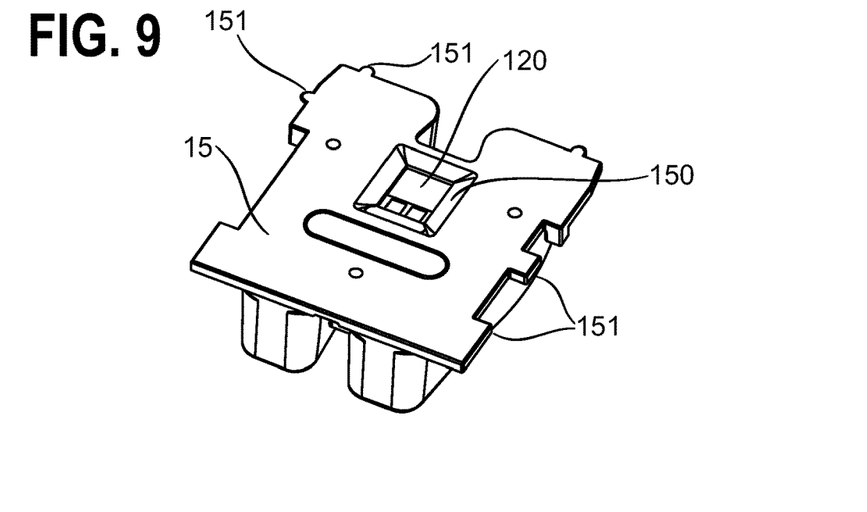
FIG. 9 shows an outer overmould encasing the inner overmould and heatsink of FIG. 8.

In FIG. 9, the inner overmould 15' and heatsink 12 have been encased in an outer overmould 15, leaving a window 150 as described above, to expose the contact region 120 of the heatsink 12. In a subsequent step, an LED module 13 can be placed onto the contact region 120 as described in FIG. 2 above to arrive at an embodiment of the inventive LED lighting unit. The diagram also indicates reference features 151 to facilitate correct placement of the LED lighting unit into a housing.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements. The mention of a "unit" or a "module" does not preclude the use of more than one unit or module.

The invention claimed is:

1. A LED lighting unit comprising:
a heatsink including a mounting surface region;
an LED module mounted onto the mounting surface region to provide a thermal connection to the heatsink, which LED module comprises a carrier, a plurality of LED dies mounted on the carrier, and LED electrode contacts formed on the carrier;
an overmould formed to encase the heatsink and to expose the mounting surface region of the heatsink upon which the LED module is mounted;
an electrical interface also encased in the overmould and arranged to electrically connect the LED module to a power supply, wherein the overmould comprises an outer overmould and an inner overmould, wherein the inner overmould encases at least part of the electrical interface; and wherein the outer overmould encases at least part of the inner overmould.

2. The LED lighting unit according to claim 1, wherein the electrical interface comprises a lead frame shaped to extend through the overmould to a socket connector formed in the overmould.

3. The LED lighting unit according to claim 1, wherein the electrical interface comprises a contact region for connecting to an electrode contact region of the LED module, and wherein the contact region is arranged to protrude from the overmould.

4. The LED lighting unit according to claim 1, wherein the electrical interface is arranged to support a plurality of electrical components of an LED driver circuit.

5. The LED lighting unit according to claim 1, wherein the carrier of the LED module comprises a ceramic carrier.

6. The LED lighting unit according to claim 1, wherein the LED lighting unit comprises a plurality of reference features formed in the overmould.

7. The LED lighting unit according to claim 1, wherein an overmould is made of a plastic material that is at least one of thermally conductive and electrically isolating.

8. The LED lighting unit according to claim 2, wherein the electrical interface comprises exposed contact regions at one end and exposed connector pins at the other end of the lead frame of the otherwise overmoulded lead frame.

9. The LED lighting unit according to claim 1 is for use in an automotive front lighting application.

10. A method of manufacturing an LED lighting unit, which method comprises:
assembling an LED module comprising a carrier, a plurality of LED dies mounted on the carrier, and LED electrode contacts formed on the carrier;
providing a heatsink with a mounting surface region for receiving the LED module to provide a thermal connection between the heatsink and the LED module;
providing an electrical interface for electrically connecting the LED module to a power supply;
encasing the heatsink and the electrical interface in an overmould, thereby leaving an opening in the overmould to expose the mounting surface on the heatsink;
mounting the LED module onto the exposed mounting surface; and
forming electrical connections between the LED module and the electrical interface, wherein the overmould comprises an outer overmould and an inner overmould, wherein the inner overmould encases at least at least part of the electrical interface; and wherein the outer overmould encases at least part of the inner overmould.

11. The method according to claim 10, wherein mounting the LED module onto the exposed mounting surface of the heatsink is performed after encasing the heatsink and the electrical interface in the overmould.

12. The method according to claim 10, wherein the LED module is mounted onto the exposed surface region using at least one of a thermal paste, a thermal pad, and an adhesive.

13. The method according to claim 10, wherein the electrical interface is encased in the overmould such that electrical contacts for connection to the LED module remain exposed.

14. The method according to claim 10, wherein the overmould is formed to include reference features to assist during mounting of the LED module onto the mounting surface of the heatsink.

15. The method according to claim 14, comprising aligning the LED module to the reference features of the overmould during the mounting of the LED module onto the exposed mounting surface.

16. The method according to claim 10, wherein the electrical interface comprises exposed contact regions at one end and exposed connector pins at the other end of a lead frame of the otherwise overmoulded lead frame.

17. The method according to claim 10, comprising electrically isolating the electrical interface from the overmould.

* * * * *